US006380728B1

(12) United States Patent
Tareilus et al.

(10) Patent No.: US 6,380,728 B1
(45) Date of Patent: Apr. 30, 2002

(54) BUS BAR FOR CONNECTING ELECTRICAL COMPONENTS WITH ARRANGEMENT FOR MEASURING CURRENT AND POWER ELECTRONICS FOR CONTROLLING AN ELECTRIC MACHINE

(75) Inventors: Alfred Tareilus, Schweinfurt; Jürgen Weimer, Euerbach, both of (DE)

(73) Assignee: Mannesmann Sachs AG, Schweinfurt (DE)

( * ) Notice: Subject to any disclaimer, the term of this patent is extended or adjusted under 35 U.S.C. 154(b) by 0 days.

(21) Appl. No.: 09/538,653

(22) Filed: Mar. 30, 2000

(30) Foreign Application Priority Data

Apr. 1, 1999 (DE) ........................................ 199 14 894

(51) Int. Cl.[7] ................................................ G01R 19/00

(52) U.S. Cl. .............................. 324/117 H; 324/117 R; 324/126

(58) Field of Search ......................... 324/117 H, 117 R, 324/127, 126

(56) References Cited

U.S. PATENT DOCUMENTS

| | | | | | |
|---|---|---|---|---|---|
| 4,823,075 | A | * | 4/1989 | Alley | 324/117 H |
| 4,864,223 | A | * | 9/1989 | Joder et al. | 324/117 H |
| 4,893,073 | A | * | 1/1990 | McDonald et al. | 324/117 H |
| 5,041,780 | A | * | 8/1991 | Rippel | 324/117 H |
| 5,583,429 | A | | 12/1996 | Otaka | 324/127 |
| 5,831,425 | A | | 11/1998 | Ochiai | 321/117 R |
| 5,872,711 | A | | 2/1999 | Janko | 363/144 |

FOREIGN PATENT DOCUMENTS

| | | |
|---|---|---|
| DE | 73 14436 | 4/1973 |
| DE | 88 13 553.0 | 10/1988 |
| DE | 94 03 108.8 | 2/1994 |
| EP | 0 929 123 | 6/1998 |
| JP | 03229161 | 10/1991 |
| JP | 06213936 | 8/1994 |
| WO | WO 99/15907 | 4/1999 |

* cited by examiner

*Primary Examiner*—Ernest Karlsen
(74) *Attorney, Agent, or Firm*—Cohen, Pontani, Lieberman & Pavane

(57) ABSTRACT

A power electronics device for controlling an electric machine, for example a permanently excited synchronous machine includes a plurality of capacitors and power semiconductors connected to a bus bar. To measure currents through the bus bar, the bus bar includes at least one portion with a shaped section. This at least one portion comprises an essentially U-shaped configuration. A sensor of a current-measuring device is provided in the vicinity of the at least one portion to measure the current flowing therethrough. The sensor is designed to measure an electric and/or magnetic field in the bus bar and is in turn connected to an evaluation device. The sensor and/or the evaluation device are disposed on at least one control printed circuit board of the power electronics device, which is arranged underneath the bus bar.

14 Claims, 1 Drawing Sheet

BUS BAR FOR CONNECTING ELECTRICAL COMPONENTS WITH ARRANGEMENT FOR MEASURING CURRENT AND POWER ELECTRONICS FOR CONTROLLING AN ELECTRIC MACHINE

BACKGROUND OF THE INVENTION

1. Field of the Invention

The present invention relates to a bus bar for connecting electrical components of a power electronics device for controlling an electric machine and an arrangement of the bus bar for measuring current and for connecting to the power electronics device for controlling an electric machine.

2. Description of the Related Art

Bus bars are used as a common connection point to connect electrical components to one another and to supply them with the necessary current. That is, a bus bar comprises a conductor or conductors for collecting electric currents and distributing them to electric components. For example, bus bars are used in particular in a power electronics device for controlling electric machines.

The electric machines controlled by the power electronics device having a bus bar may include synchronous machines for generating electrical power. The electrical power generated by the synchronous machine is then made available to an extremely wide range of loads. These loads are usually connected into electrical networks. An example of the electrical network includes an on-board networks for motor a vehicle. When the electric machine is used in a motor vehicle, limited installation space is available for the electric machine and for the components needed to control the electric machine, which also include the power electronics device. The individual components must therefore be configured to be as compact and space-saving as possible while simultaneously being sufficiently powerful. This is especially important in the motor vehicle industry, where new electrical components are constantly being introduced.

The power electronics device mentioned above is used to drive an electric machine. For this reason, high currents flow through the power electronics device during operation. Furthermore, to adequately regulate and monitor the electric machine, the currents flowing through the power electronics device must be measured.

In the prior art, separate current-measuring devices have been used for these current measurements. These current-measuring devices generally comprise a sensor and an evaluation device connected to said sensor. To carry out the current measurement, the sensor is connected to a conductor through which the current to be measured flows. In one known embodiment for measuring current, it is necessary for the conductor in which the current is measured to be present as an independent component. This conductor then has to be mounted on an appropriate base structure. The drawback with such an embodiment, however, is that a large number of components are needed, and contact has to be made between all of them one after another. Thus, the conductor used for the current measurement must be mounted on the base structure. The sensor must then be mounted and contact must be established with this current conductor. As a result, the production of such an arrangement for measuring current is complicated in constructional terms and therefore costly. Therefore, this arrangement has a particularly detrimental effect in the speed of mass production and in keeping down the cost of the automobile.

In a further known embodiment for measuring current, the current-carrying conductor used for current measurement is applied to a printed circuit board. Contact is then made between this current conductor and the sensor of the current-measuring device. However, the disadvantage here is that the ability of printed circuit boards to carry current is restricted. Current measurement using this technique is limited to a small current class and is therefore not suitable for the power electronics device described above in which high currents have to be measured.

SUMMARY OF THE INVENTION

The object of the present invention is to provide a bus bar with an arrangement for measuring current and power electronics in which even high currents can be measured in a cost-effective and simple device. The object of the present invention is also to avoid the problems of the prior art.

According to a first embodiment of the present invention, the object is achieved by a bus bar constructed in one or more layers for connecting electrical components for a power electronics device for controlling an electric machine. According to the present invention, the bus bar is defined in that it has at least one portion with a shaped section that is connected or connectable to a current-measuring device.

In this way, electrical currents may be measured in a manner which is simple to construct and inexpensive. The present invention is based on the basic idea that the separate current conductors which were previously required for the current measurement may be eliminated. Instead of a separate conductor, the current conductor is now formed by a portion of the bus bar. This portion is a shaped section which may be formed, for example, as a projection. In principle, the present invention is not restricted to a specific number or shape of the particularly formed portions of the bus bar. Instead, the configuration criteria are given by the requirements of the particular application.

Since the portion with a shaped section which is used for current measurement is a permanent constituent of the bus bar, the current-measuring methods used for measuring the current may be implemented cost-effectively even for high currents. To this end, the bus bar, and in particular the portion with a shaped section, must be designed appropriately. In addition, the previously required step of mounting the separate conductor used for the current measurement on a base structure is eliminated. As a result, the construction is simplified and the production costs are also reduced. The bus bar constructed in accordance with the present invention avoids the disadvantages described in the prior art.

The at least one portion of the bus bar having a shaped section provided according to the present invention is connected or connectable to a current-measuring device, via which the current flowing through the at least one portion is measured. More detailed explanations relating to the current-measuring device and to its connection with the portion of the bus bar follow in the further course of the description.

The bus bars according to the present invention may be constructed in one or more layers. If the bus bars are constructed in more than one layer, the individual layers may be connected to one another by a suitable process such as, for example, by a lamination process. In this case, individual layers may comprise conductive material and other layers may comprise an insulating material. The use of bus bars for providing a simple and safe option for supplying different loads with current is well known. However, the complicated cabling used in known bus bar arrangements is eliminated by the present invention such that the use of the inventive bus bar leads to space savings in relation to the installation space. This is particularly advantageous when the bus bar is used in a power electronics device for operating an electric machine in a motor vehicle.

In a preferred embodiment of the bus bar according to the present invention, the bus bar may advantageously be formed from one or more layers of copper or aluminum. Of course, other materials may also be used. However, an important characteristic is that the material used is a good conductor of an electric current. Therefore, the bus bar advantageously comprises one or more layers of solid copper.

The bus bar according to the present invention advantageously has a plate-like basic structure. Bus bars of this type are easily produced and may be connected up to a large number of electrical loads, while requiring only a small amount of installation space.

In a further embodiment, the at least one portion of the bus bar with a shaped section is constructed in the area of one of the ends of the bus bar. In a particular embodiment, the bus bar has a plate-like, rectangular basic structure and the portion with a shaped section is accordingly advantageously constructed in one or more corners of the bus bar. In this case, the portion may be constructed, for example, as a projection which is likewise rectangular, so that the portion via which the current measurement takes place projects beyond the side edges of the bus bar.

The bus bar may advantageously have an essentially T-shaped structure. In this case, the vertical leg of the "T" forms the basic structure of the bus bar and the at least one portion with a shaped section is preferably constructed in the transverse area, perpendicular to the leg, of the T-shaped bus bar. A bus bar constructed according to this embodiment may be produced simply and cost-effectively.

In a further refinement, at least one slot is provided in the portion with a shaped section to subdivide the current-carrying paths. The current-carrying conductor paths are normally machined into the bus bar during the production process. The slot or slots have the function of interrupting current-carrying paths within the bus bar and, as a result, of guiding the current in a different direction. The slot or slots in the at least one portion with a shaped section therefore have the function of routing the current to that point which is connected or connectable to a current-measuring device, described in more detail further below. The number and configuration of the slots may vary widely depending on the requirements of the particular application in which they are used.

The at least one portion with a shaped section may advantageously have an essentially U-shaped configuration. To this end, the portion is preferably constructed as a shaped section in the form of a rectangular projection. The interspace bounded by the two legs of the "U" is formed by the above-described slot.

According to a further aspect of the present invention, an arrangement for measuring current is provided, which firstly has a bus bar according to the invention and as described above, in which a current is to be measured. The arrangement further comprises a current-measuring device including a sensor and an evaluation device connected to the sensor.

The arrangement according to the present invention for measuring current allows the measurement of high currents using a simple construction and cost-effective method. In relation to the advantages, actions, effects and the functioning of the arrangement, reference is hereby made to all of the above explanations relating to the bus bar according to the invention.

In a preferred embodiment of the arrangement according to the present invention, the sensor for measuring the current is advantageously disposed physically close to the at least one portion with a shaped section of the bus bar. The sensor is not required to be connected directly to the at least one portion. Instead, the at least one portion of the bus bar and the sensor may be arranged physically separated and without any direct connection. The important factor is merely that the sensor for measuring the current in the bus bar is suitable, for example, in that it can detect a parameter which indicates the current flowing through the bus bar, such as, the electric and/or magnetic fields in the bus bar.

In another embodiment, the sensor is connected to the at least one portion of the bus bar with the shaped section such as, for example, by a suitable electrical connection.

The sensor is advantageously designed to measure an electric and/or magnetic field. Of course, other sensor elements which measure parameters indirectly or directly related to the electric current in the bus bar are also conceivable. In a further embodiment, the sensor may be designed as a sensor element based on magnetoresistance or on the Hall effect. Accordingly, the invention is not restricted to the two examples of the sensors described above. Any sensor that detects a parameter which indicates current in the at least one portion of the bus bar may be used.

According to a third aspect of the present invention, a power electronics device for controlling an electric machine is provided, which includes a power part having a plurality of capacitors and a plurality of power semiconductors. Furthermore, the power electronics device has a bus bar according to the invention and as described above, which is connected to the capacitors and the power semiconductors.

Electric machines are preferably driven via such power electronics devices. The currents flowing through the device may be measured in a simple—in particular a constructionally simple—and inexpensive way as a result of their configuration. In relation to the advantages, actions, effects and the functioning of the power electronics device, reference is again made to all of the above explanations relating to the bus bar according to the invention and to the arrangement for current measurement according to the invention.

The arrangement of the individual components according to the present invention provides a power electronics device of compact design, in which the individual components are disposed in an optimized way so that the arrangement of the individual components in the power electronics device allow the power electronics device to require only a small installation space. As a result, the power electronics device according to the present invention are particularly suitable for use in the motor vehicle sector. Furthermore, the special design of the bus bar allows the current to be measured directly on said bus bar via the current-measuring device. This considerably simplifies the production of the arrangement and therefore also leads to savings in costs.

The configuration of the power electronics depends to a great extent on the voltage level required. For this reason, the number of capacitors and power semiconductors may vary depending on the design of the power electronics device. Accordingly, the invention is not restricted to a specific number of capacitors and power semiconductors.

Suitable power semiconductors preferably comprise MOSFETs, IGBTs or other devices of similar characteristics and capacities. The choice of which of the suitable power semiconductors is to be used for a particular application is made on the basis of the power requirements on the particular application in which power electronics device is used. If the power electronics device is to be used, for example, within the framework of the 42 V on-board network planned by the automobile industry, via which in the future newly introduced electrical components such as, for example, windshield heating, electric valve operation and other components are to be operated, MOSFET devices are preferably used as the power semiconductors. IGBT devices are used, for example, at higher voltages.

The individual capacitors and power semiconductors are connected to the bus bar and wired and are therefore electrically interconnected via the bus bar.

The arrangement of power electronics device according to the present invention may advantageously be used for controlling a synchronous machine, more specifically, a permanently excited synchronous machine. In particular, the power electronics device according to the present invention may be used for controlling a starter generator such as, for example, a starter generator for motor vehicles. The starter generator may comprise an electric machine whose rotors are mounted over the crankshaft mounting of an internal combustion engine. This particular starter generator is used not only for starting and stopping the engine but may also perform various functions during engine operation, such as braking functions, booster functions, battery management, active vibration damping, and synchronization of the internal combustion engine.

An example of the type of power electronics device to be used in the arrangement according to the present invention are disclosed in German reference P 199 13 450, likewise filed by the applicant but not yet published, the content of which is incorporated herein by reference.

In a further preferred embodiment of the power electronics device according to the present invention, a number of terminals are advantageously provided, which are connected to the bus bar. The current to be collected and distributed by the bus bar is fed to the bus bar via these terminals.

In a further embodiment, at least one control printed circuit board is arranged with the bus bar and connected to the power semiconductors. The signal paths for the power semiconductors are also advantageously located on this control printed circuit board, in addition to other components.

In addition, a current-measuring device as provided in the arrangement for measuring current in the at least one portion of the bus bar according to the present invention described above, is advantageously arranged on the printed circuit board. This current-measuring device has a sensor and an evaluation device connected to said sensor, both of which are advantageously arranged on the control printed circuit board. The sensor and/or the evaluation device may be mounted on the printed circuit board using a conventional method such as, for example, surface mounted device techniques together with other components which are needed on the control printed circuit board. As a result, the intermediate step which was previously required in the prior art for mounting the current-measuring device or for making contact with the current-measuring device may be eliminated.

The joining of the bus bar and the control printed circuit board is effected normally during the mounting of the power electronics. The sensor for measuring current is brought into contact with the bus bar when the control printed circuit board is mounted on the bus bar.

In this case, the sensor is advantageously constructed underneath the at least one portion with a shaped section of the bus bar so that current measurement may be performed in the at least one portion. The sensor may be provided physically close to the at least one portion, but without contacting the at least one portion directly—for example via a suitable electrical connection. If the sensor is located sufficiently close to the close to the at least one portion of the bus bar, the electric and/or magnetic fields generated by the current flowing through the bus bar may be detected by sensor to measure the current.

The particular advantage of the solution according to the invention as compared with the solutions disclosed by the prior art is that the components of the current-measuring device may be fitted to the control printed circuit board without additional effort during the production of the printed circuit board. After production of the control printed circuit board, the bus bar is subsequently connected to the control printed circuit board such that the at least one portion with the shaped section of the bus bar comes into operational contact with the sensor such that—for example as described above a current measurement may be made. In the solutions disclosed by the prior art, on the other hand, it was necessary for the current conductor provided for current measurement to be fixed first onto a basic structure such as, for example, a printed circuit board by a separate operation. Furthermore, in a second intermediate step according to the prior art, the current-measuring device had to be fitted to the basic structure and contact had then to be made between the current-measuring device and the current conductor. These additional and complicated operation are now eliminated.

The control printed circuit board is preferably designed using Surface Mounted Device (SMD) techniques and performs all the control, monitoring and regulating functions of the power electronics, including the driving of the power semiconductors. For the control of the power electronics, a control device including a powerful microcontroller is preferably arranged on the control printed circuit board, all the functions advantageously being predefined via a Controller Area Network (CAN) bus. Depending on the requirement of the particular application, the control device may comprise further elements.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The single

DETAILED DESCRIPTION OF THE PRESENTLY PREFERRED EMBODIMENTS

Figure 1:
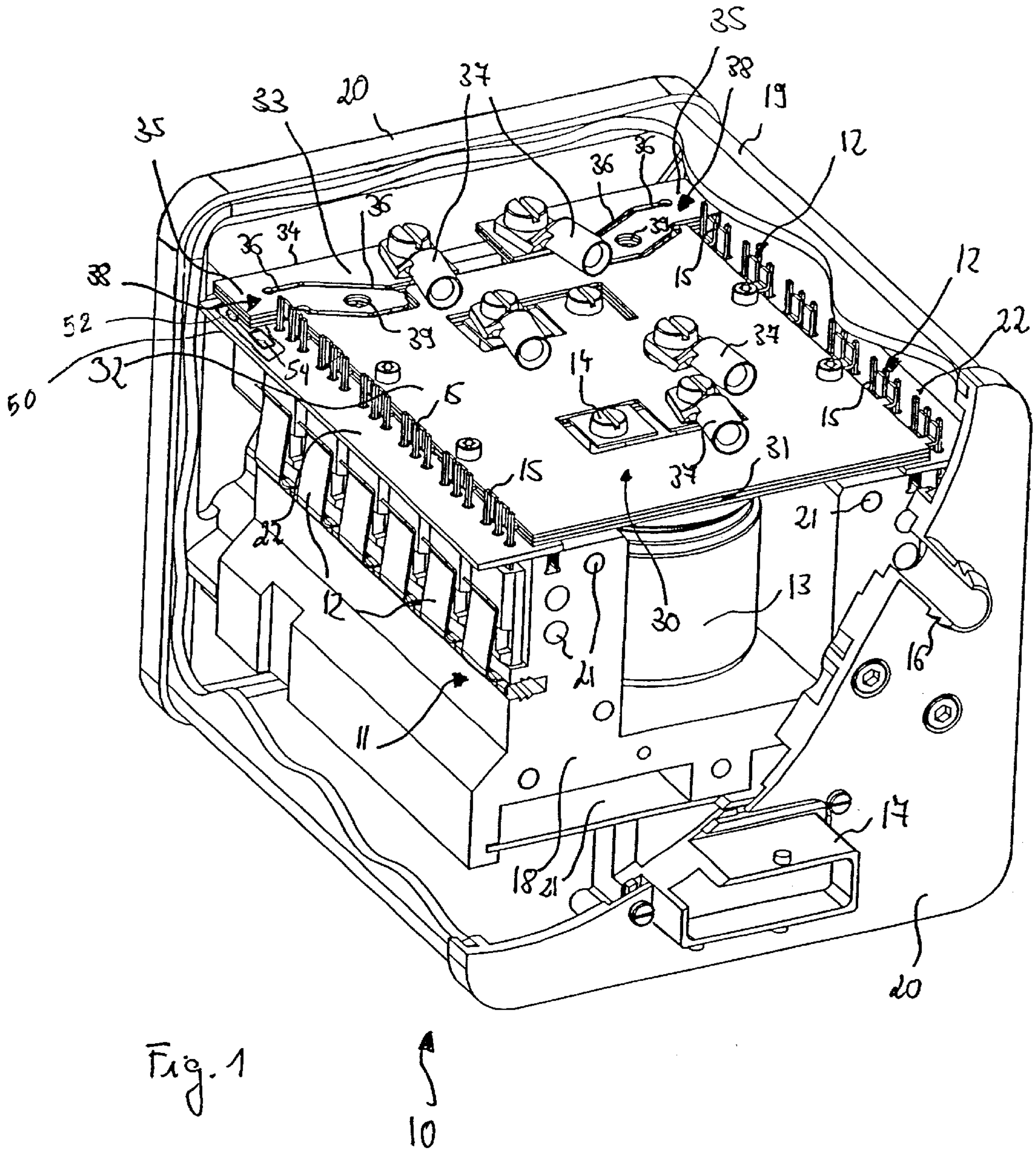
FIG. 1 is a perspective partial cut-away view of an arrangement of a bus bar and power electronics according to the present invention.

FIG. 1 illustrates a power electronics device 10 for controlling an electric machine, the electric machine being a starter generator for a motor vehicle, which is constructed as a permanently excited synchronous machine.

The power electronics device 10 includes a housing 19 produced as a deep-drawn aluminum part. The housing 19 is closed on all sides apart from a housing opening in the end. This prevents contaminants or moisture being able to penetrate into the power electronics device 10 from the outside and damaging the components arranged therein. The housing 19 may also have two housing openings provided in opposing ends. The housing opening or openings are closed by a covering element 20 which is detachably connected to the housing 19. As a result, the components in the housing 19 may be easily removed from the housing 19 such as, for example, during servicing or repair procedures. To prevent the ingress of dirt or moisture into the housing 19 via the housing opening, a suitable sealing element is advantageously provided between the covering element 20 and the housing 19. The covering element 20 has a number of openings, through which terminal elements 16, 17 are led. The covering element 20 therefore functions as a terminal board for the power electronics device 10.

As can also be seen from FIG. 1, the power electronics device 10 has a power part 11 arranged in the housing 19. The power part 11 includes a plurality of capacitors 13 which are connected to a bus bar 30 via a screw connection 14. In addition, the power part 11 also includes a plurality of power semiconductors 12 which are also connected to the bus bar 30 via tabs 15. The tabs 15 may be connected to the bus bar 30 via a solder connection, for example. Of course, other possibilities of connecting the power semiconductors 12 to the bus bar 30 are also conceivable. For example, mention should be made here, inter alia, of crimp connections, connections by means of sleeves, welded connections such as ultrasonic welds, or the like. Accordingly, the invention is not restricted to specific types of connection of the power semiconductors 12 and capacitors 13 to the bus bar 30.

In the present case, the power semiconductors 12 comprise MOSFETs. Both the capacitors 13 and the power semiconductors 12 are connected for current distribution via the bus bar 30.

The capacitors 13 are disposed in a row centrally in the housing 19 and are flanked by two rows of power semiconductors 12. Accordingly the power semiconductors 12 are located between a side wall of the housing 19 and the capacitors 13.

To dissipate the heat produced by heat loss of the power semiconductors 12 and the capacitors 13 during the operation of the power electronics 10, a cooling device 18 is arranged in the housing 19. In this case, the cooling device 18 is arranged relative to the power semiconductors 12 and the capacitors 13 so that an exchange of heat takes place or can take place between the elements and the cooling device 18.

The cooling device 18 is constructed as a deep-drawn aluminum section or extruded aluminum section and has an essentially U-shaped cross section. Of course, depending on the requirements of a particular application other cross sections such as, for example, an L-shaped cross section or the like may also be conceivably used for the cooling device 18. In the case of a U-shaped configuration, the cooling device 18 has two side legs and a base area. The capacitors 13 are disposed in a chamber formed by the side legs and the base area, so that cooling can take place both in the lateral direction and downward and from below. The power semiconductors 12 are preferably disposed outside the side legs of the cooling device 18. This ensures lateral cooling of the power semiconductors 12 via the side legs, without any hindrance being able to arise, from the point of view of the cooling, between the capacitors 13 and the power semiconductors 12.

To assist the cooling action of the cooling device 18, cooling channels 21 are provided in the side legs and in the base area of the cooling device 18. A suitable cooling medium flows through the cooling channels 21. To this end, the cooling channels 21 are connected to a source (not illustrated) for a cooling medium such as, for example, water or the like. If, as in the present exemplary embodiment, the power electronics device 10 is used in conjunction with a starter generator for a motor vehicle, the source for the cooling medium may be the conventional cooling circuit of the internal combustion engine. A connecting element of the cooling device 18 is then connected to the cooling circuit of the internal combustion engine, so that cooling water circulating in the internal combustion engine also flows through the cooling device 18 of the power electronics device 10. A result of this embodiment is that additional coolers, pumps or the like for the cooling device 18 are not required. The particular advantage of this is that the cost and space required by the power electronics device 10 is minimized.

To operate the power electronics device 10, two control printed circuit boards (PCBs) 22 are arranged within the housing 19. The control PCBs 22 are preferably designed using surface mount device (SMD) techniques and preferably perform all the control, monitoring and regulating functions, including driving the power semiconductors 12. Accordingly, signal paths for the power semiconductor 12 may be located on the control printed circuit boards 22.

As stated above, the bus bar 30, via which the capacitors 13 and the power semiconductors 12 are connected, is arranged in the housing 19 of the power electronics device 10. The bus bar 13 supplies current to the components wired up to it. To this end, the bus bar 30 includes a plurality of terminals 37. The bus bar 30 comprises a plurality of conductive layers 31, which are preferably formed of solid copper. Of course, the conductive layers 31 may also be formed of other electrically conductive materials. Furthermore, the bus bar 30 may comprise only one conductive layer 31.

The bus bar 30 comprises a plate-like rectangular basic structure 32 and has a T-shaped structure. To this end, the bus bar 30 has a transverse area 33 at one of its ends 34.

In FIG. 1, both opposing sides of the transverse area 33 have a portion 35 with a shaped section. This portion 35 has an essentially U-shaped configuration 38, the interspace between the two legs of the "U" being formed by a slot 36. The slot 36, and further slots 36 illustrated in FIG. 1 subdivide the current-carrying paths of the bus bar 30 and form the legs of the U-shaped configuration 38.

Finally, further various contacting means 39 are provided in the bus bar 30.

Using the bus bar 30, the high currents distributed to the power electronics device 10 may be measured. The current measurement is made via the appropriately constructed portions 35. The current is routed into these portions 35 by the slots 36.

Underneath the portions 35 of the bus bar 30, the control PCBs 22 are arranged physically close to the portions 35 so that a sensor 52 of a current-measuring device 50 arranged on the control PCBs 22 is operatively arranged so that it detects the electric and/or magnetic fields generated by the current passing through the portion 35 of the bus bar 30. The measured values are forwarded to an evaluation device 54 of the current-measuring device 50, which is likewise disposed on the control PCB 22. As a result, using the known and conventional current-measuring methods, it is possible to measure the currents in a simple and cost-effective way, even in power electronics operating with high currents.

Instead of measuring the electric and/or magnetic fields, the sensor 52 may be based on magnetoresistance and/or the Hall effect.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

We claim:

1. A power electronics device for controlling an electric machine, comprising:

a power part including a plurality of capacitors and a plurality of power semiconductors, and a bus bar comprising at least one conductive layer with at least one portion having a shaped section operatively connectable to a current-measuring device, said bus bar being plate-shaped and connected to said capacitors and said power semiconductors for distributing current, wherein at least one portion of said bus bar comprises a shaped section operatively arrangeable relative to a current measuring device such that the current-measuring device detects a parameter indicating a current flow through the shaped section and wherein said at least one portion comprises a slot operatively arranged for subdividing a current carrying path through said at least one portion.

2. The power electronics device of claim 1, wherein a material of said at least one conductive layer comprises one of copper and aluminum.

3. The power electronics device of claim 1, wherein said at least one portion with said shaped section is arranged proximate an end of said bus bar.

4. The power electronics device of claim 1, wherein said bus bar comprises an essentially T-shaped structure comprising a vertical section and a transverse section, and wherein said at least one portion with said shaped section is arranged in said transverse area of said T-shaped structure.

5. The power electronics device of claim 1, wherein said at least one portion comprises a U-shaped configuration.

6. The power electronics device of claim 1, further comprising:

a current-measuring device having a sensor and an evaluation device connected to said sensor, wherein said sensor is operatively arranged for detecting a parameter indicating a current flow through the shaped section of said at least one portion of said bus bar.

7. The power electronics device of claim 6, wherein said sensor for measuring the current is proximate said at least one portion with the shaped section of the bus bar.

8. The power electronics device of claim 6, wherein said sensor is connected to said at least one portion with the shaped section of the bus bar.

9. The power electronics device of claim 6, wherein said sensor is operative for measuring at least one of an electric field and a magnetic field generated by current flowing through said at least one portion.

10. The power electronics device of claim 6, wherein said sensor comprises a sensor element based on one of magnetoresistance and the Hall effect.

11. The power electronics device of claim 1, further comprising a plurality of terminals connected to said bus bar.

12. The power electronics device of claim 1, further comprising at least one control printed circuit board connected to said power semiconductors.

13. The power electronics of claim 1, further comprising a current-measuring device having a sensor and an evaluation device connected to said sensor, wherein at least one of said sensor and said evaluation device is arranged on said control printed circuit board.

14. The power electronics device of claim 13, wherein said sensor is constructed underneath said at least one portion of said bus bar with the shaped section for detecting a parameter indicating a current flow through the shaped section.

* * * * *